(12) United States Patent
Kobayashi

(10) Patent No.: US 6,404,281 B1
(45) Date of Patent: Jun. 11, 2002

(54) WIDE DYNAMIC RANGE TRANSIMPEDANCE AMPLIFIER

(75) Inventor: Kevin Wesley Kobayashi, Torrance, CA (US)

(73) Assignee: Sirenza Microdevices, Inc., Long Beach, CA (US)

( * ) Notice: Subject to any disclaimer, the term of this patent is extended or adjusted under 35 U.S.C. 154(b) by 0 days.

(21) Appl. No.: 09/712,533

(22) Filed: Nov. 14, 2000

(51) Int. Cl.[7] ................................................ H03F 1/36
(52) U.S. Cl. ............................ 330/85; 330/86; 330/282; 330/301
(58) Field of Search ............................. 330/85, 86, 282, 330/301

(56) References Cited

U.S. PATENT DOCUMENTS

| | | | | |
|---|---|---|---|---|
| 3,708,754 | A | * | 1/1973 | Diehl ........................... 330/85 |
| 5,398,004 | A | | 3/1995 | Kobayashi ................... 330/293 |
| 5,646,573 | A | | 7/1997 | Bayruns et al. ................ 330/59 |
| 5,995,261 | A | * | 11/1999 | Asous .......................... 359/163 |
| 6,069,534 | A | | 5/2000 | Kobayashi ................... 330/308 |
| 6,259,312 | B1 | * | 7/2001 | Murtojärvi ................... 327/563 |
| 6,285,259 | B1 | * | 9/2001 | Franck et al. ................ 330/301 |
| 6,297,701 | B1 | * | 10/2001 | Visocchi et al. ............. 330/308 |
| 6,300,833 | B1 | * | 10/2001 | Vyne et al. ................... 330/257 |

OTHER PUBLICATIONS

Integrated High Frequency Low–Noise Current–Mode Optical Transimpedance Preamplifiers: Theory and Practice, By Tongtod Vanisri et al., IEEE Journal of Solid–State Circuits, vol. 30, No. 6, Jun. 1995, pp. 677–685.

Wide–Band Integrated Optical Receiver with Improved Dynamic Range Using a Current Switch at the Input, By. L.A.D. van den Broeke et al., IEEE Journal of Solid–State Circuits, vol. 28, No. 7, Jul. 1993, pp. 862–864.

* cited by examiner

*Primary Examiner*—Michael B. Shingleton
(74) *Attorney, Agent, or Firm*—Christopher P. Malorana, P.C.

(57) ABSTRACT

An apparatus comprising an amplifier circuit and a control circuit. The amplifier circuit may be configured to generate an amplified signal in response to an input signal. The control circuit generally comprises a differential amplifier having (i) a first input coupled to said amplified signal and (ii) a second input coupled to a reference voltage. The control circuit may be configured to control a gain of the amplifier circuit by adjusting the input signal based on (i) a magnitude of the amplified signal and (ii) the reference voltage.

27 Claims, 17 Drawing Sheets

WIDE DYNAMIC RANGE TRANSIMPEDANCE AMPLIFIER

FIELD OF THE INVENTION

The present invention relates to a method and/or architecture for implementing wide dynamic range amplifiers generally and, more particularly, to a method and/or architecture for implementing transimpedance amplifiers with improved linearity and dynamic range that may be used in broadband telecom and datacom applications.

BACKGROUND OF THE INVENTION

Wide dynamic range amplifiers are widely employed in the wireless and wireline industry. Conventional transimpedance amplifiers used in fiber optic systems must receive photo-diode currents ranging from as low as a few micro-amps to as high as a few milli-amps, while maintaining low duty-cycle distortion and minimal intersymbol interference (ISI). Conventional approaches for improving linearity and dynamic range, especially when encountering high incident input powers, include [1] automatic gain control field effect transistor (FET) amplifiers (e.g., U.S. Pat. No. 5,646,573); [2] common-base inputs stage amplifiers (e.g., Integrated High Frequency Low Noise Current Mode Optical Transimpedance Preamplifier: Theory and Practice, IEEE JSSC, June 1995, pp. 667); [3] complementary common-base input amplifiers (e.g., U.S. Pat. No. 6,069,534); and [4] differential common-base amplifiers with current switch inputs (e.g., Wide-Band Integrated Optical Receiver with Improved Dynamic Range Using a Current Switch at the Input, IEEE JSSC, Vol. 28, No. 7, July 1991, pp. 862–864), all of which are hereby incorporated by reference in their entirety.

Additionally, providing a monitor current which is linearly proportional to a received optical power is difficult. Providing a linearly proportional monitoring current is challenging due to nonlinear transimpedance gain when high incident powers and/or automatic gain control means are employed.

It would be desirable to provide a microwave monolithic integrated circuit (MMIC) amplifier which can amplify a large input signal while minimizing signal distortion. Such an amplifier is coveted by engineers who are trying to build superior radio frequency (RF) and fiber-optic receiver systems.

SUMMARY OF THE INVENTION

The present invention concerns an apparatus comprising an amplifier circuit and a control circuit. The amplifier circuit may be configured to generate an amplified signal in response to an input signal. The control circuit generally comprises a differential amplifier having (i) a first input coupled to said amplified signal and (ii) a second input coupled to a reference voltage. The control circuit may be configured to control a gain of the amplifier circuit by adjusting the input signal based on (i) a magnitude of the amplified signal and (ii) the reference voltage.

The objects, features and advantages of the present invention include providing a method and/or architecture for implementing amplifiers with improved linearity and dynamic range that may (i) provide wide dynamic range in a low noise amplifier; (ii) be implemented in wireless RF applications; (iii) be implemented in a transimpedance amplifier for fiber-optic applications; (iv) be implemented without sacrificing the low noise input sensitivity of conventional amplifiers; and/or (v) be used in broadband telecom and datacom applications.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

The present invention may provide an automatic gain control circuit and/or method that employs a current switch at an input of a high sensitivity common-emitter input stage single-dended transimpedance amplifier. The present invention may enable superior dynamic range while maintaining the intrinsic high input sensitivity of the low noise common-emitter input stage. The present invention provides automatic gain control that improves the linearity and reduces the distortion of an amplified signal. The need for improved linearity and reduced distortion of an amplified signal stems from the varying incident signal power strengths that a low noise amplifier (LNA) may encounter due to varying distances and attenuations between the transmitter and receiver.

In general, the present invention describes an automatic gain control implementation of a broadband transimpedance amplifier that may be used in fiberoptic receiver applications. More specifically, the present invention describes a bipolar amplifier implementation using heterojunction bipolar transistor technology.

Figure 1:
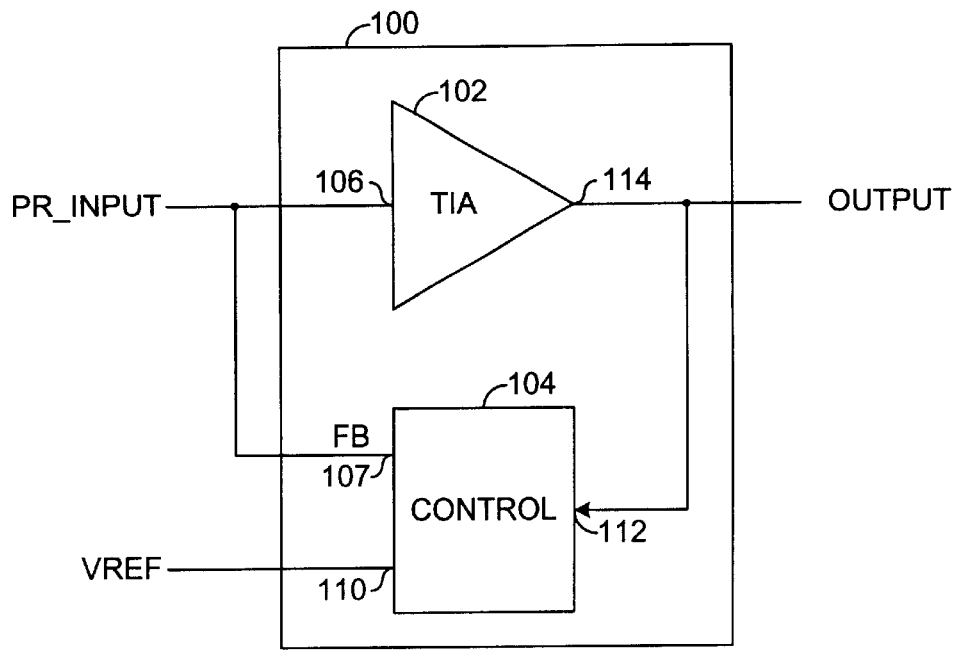
FIG. 1 is a block diagram of a preferred embodiment of the present invention.

Referring to FIG. 1, a block diagram of a circuit 100 illustrating a preferred embodiment of the present invention is shown. The circuit 100 generally comprises an amplifier block (or circuit) 102 and a control block (or circuit) 104. The circuit 102 may be implemented as a transimpedance amplifier (TIA). The circuit 102 may have an input 106 that may receive an input signal (e.g., PR_INPUT). The control circuit 104 may have an output 107 that may present a feedback signal (e.g., FB) to the input 106. The control circuit 104 may also have an input 110 that may receive a signal (e.g., VREF) and an input 112 that may receive a signal (e.g., OUTPUT) presented by an output 114 of the amplifier 102.

Figure 2A:
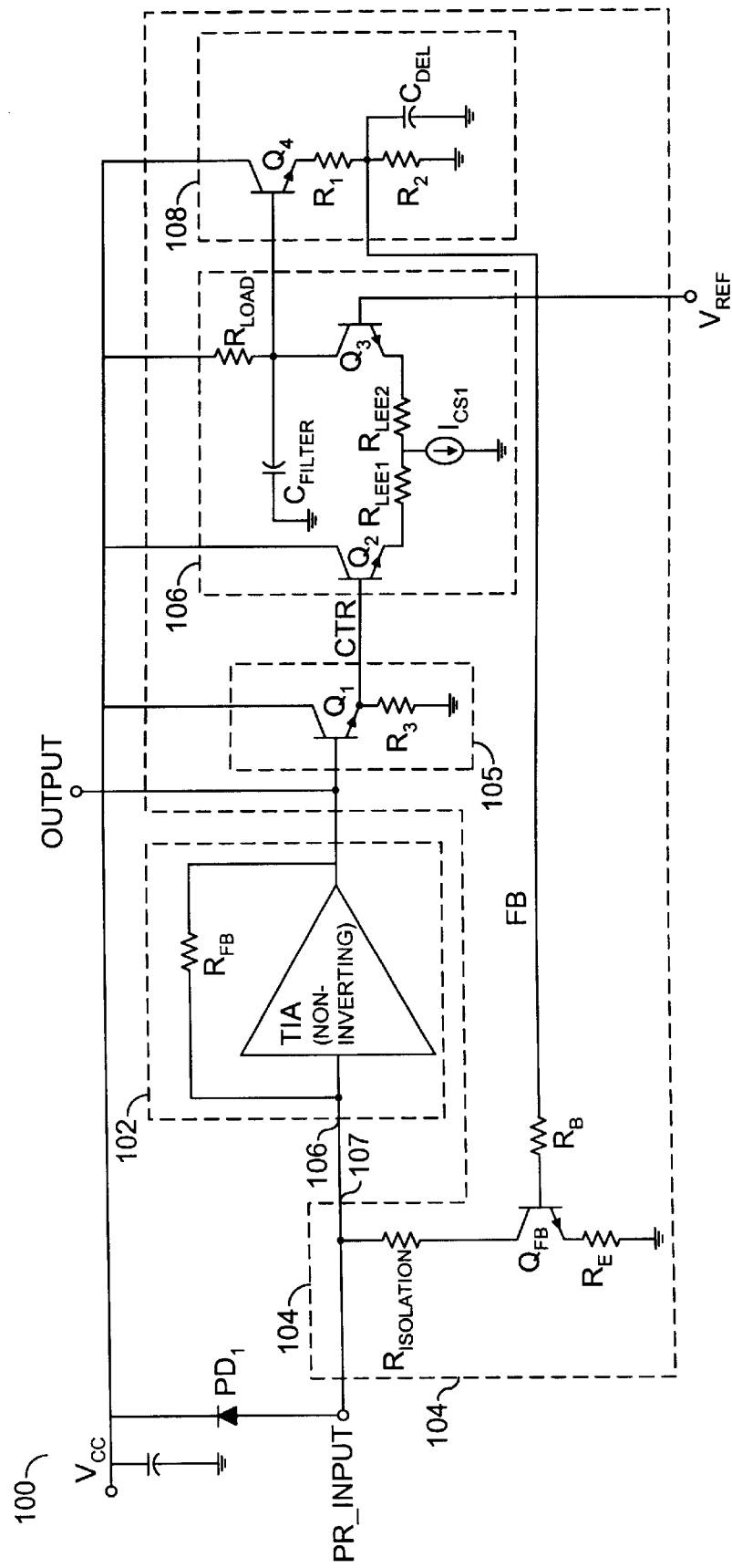
FIGS. 2(a–b) are detailed block diagrams of preferred a embodiments of the present invention.

Referring to FIG. 2a, a more detailed diagram of the circuit 100 is shown. The circuit 100 generally comprises a diode (e.g., PD1), the amplifier block (or circuit) 102 and the control block (or circuit) 104. The control circuit 104 generally comprises a circuit 105, an amplifier block (or circuit) 106 and an output block (or circuit) 108. The control circuit 104 may be implemented as an automatic gain control circuit. The amplifier circuit 106 may be implemented as a high gain differential amplifier circuit. The circuit 102 may be implemented, in one example, as a 10 Gb/s transimpedance amplifier. In another example, the circuit 102 may be implemented as a photo-receiver that may be used for datacom and telecom applications. However, the circuit 102 may be implemented as other appropriate amplifiers to meet the design criteria of a particular implementation.

The circuit 105 generally comprises a transistor (e.g., Q1) and a bias resistor (e.g., R3). The transistor Q1 is generally configured as an emitter follower. The circuit 105 may allow direct coupling and detection of the amplified signal OUTPUT presented by the amplifier circuit 102 to be fed into the high gain differential amplifier circuit 106. The high gain differential circuit 106 generally comprises a differential transistor pair (e.g., Q2 and Q3), a current source (e.g., Ics1), a number of emitter degeneration resistors (e.g., Rlee1 and Rlee2), and a load resistor (e.g., Rload). One of the differential transistors Q2 and Q3 generally receives the input reference VREF. The other one of the differential transistors generally receives a signal (e.g., CTR) from the circuit 105. The signal VREF may allow post production configuration of the circuit 100. Such post production configuration may compensate for process, temperature, and other fabrication variances. The signal VREF may be generated externally by a device (not shown) such as a microprocessor, a digital-to-analog converter (DAC) or other appropriate device needed to meet the design criteria of a particular implementation.

The resistors Rlee1 and Rlee2 may be adjusted for optimal loop gain and sensitivity as well as stability (to be described in more detail in connection with FIGS. 3(a–c)). A low pass filter response may be provided by a capacitor (e.g., Cfilter) that may be connected to a collector of the transistor Q3. The capacitor Cfilter generally integrates the detected signal introduced into a base of the transistor Q1. Furthermore, the high frequency components of the amplified signal are generally filtered as determined by a capacitance value of the capacitor Cfilter. The circuit 108 generally comprises a transistor (e.g, Q4), a resistor (e.g., R1) and a resistor (e.g., R2). The transistor Q4 may be configured as an emitter follower. The circuit 108 is generally implemented to tap out the filtered signal on the collector of the transistor Q3.

Another integration capacitor (e.g., Cdet) may be implemented to further filter and integrate the signal FB. The size of the capacitor Cdet and the capacitor Cfilter may be adjusted in order to filter out the high frequency content of the amplified signal as well as to set the integration time constant of the control circuit 104. The integrated output FB taken from the voltage divider provided by the resistors R1 and R2 may be directly fed into a variable current source transistor (e.g., QFB) through a resistor (e.g., RB). An emitter resistor (e.g., RE) on the emitter of the transistor QFB may (i) prevent excessive current through the transistor QFB and (ii) provide control loop stability. An isolation resistor (e.g., Risolation) may be used to reduce the parasitic capacitance loading of the input of the amplifier 102 due to the collector to base parasitic capacitance "Ccb" and the collector to emitter parasitic capacitance "Cce" of the transistor QFB. A typical value for the resistor Risolation may be between 50 and 200 ohms, more preferably between 75 and 150 ohms, and most preferably around 100 ohms.

The operation of the automatic gain control (AGC) circuit 104 may be adjusted by varying the resistors RE, Rlee1, Rlee2 and Rload for loop gain. The capacitors Cfilter and Cdet may be varied to adjust low pass filtering and set the integration time constant of the amplified detected signal at the output of the amplifier 102. The threshold at which the variable current source transistor QFB turns on may be set by the resistor divider ratio of R1 and R2.

Figure 2B:
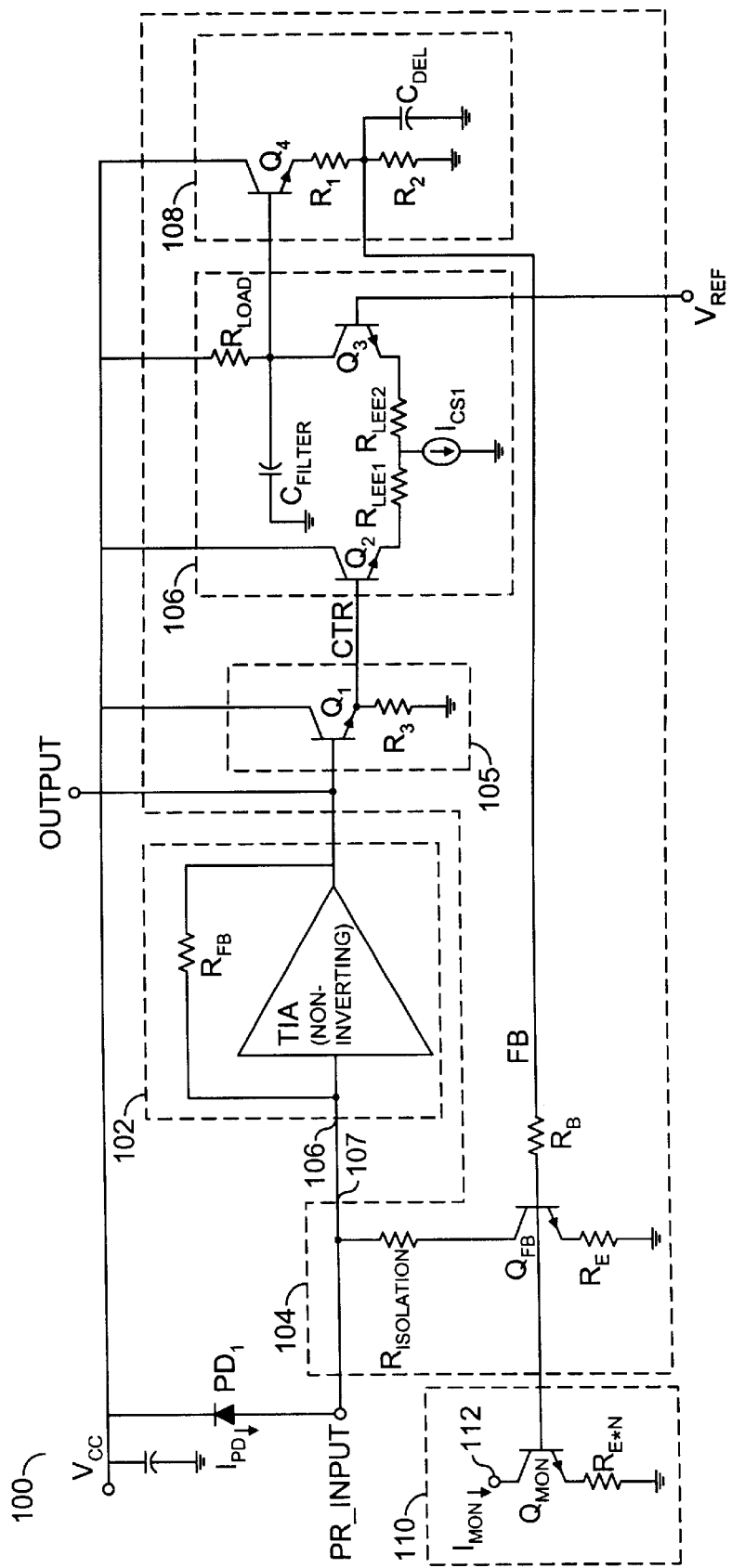

Referring to FIG. 2b, a block diagram 100 of another preferred embodiment of the present invention is shown. The present invention further includes an apparatus for monitoring received optical power through a monitor current. The monitor current may be proportional to the induced photocurrent at the input 106 of the transimpedance amplifier 102. Such an implementation allows the end user the ability to track and monitor the exact signal strength of the optical power received. Additionally, the present invention may facilitate the employment of closed loops utilized to level incident input powers as well as monitor the traffic through an array of receivers in an optical network.

In a case where a high optical power is received and automatic gain control is employed with the TIA 102 (to improve the dynamic range), the output voltage of the TIA 102 generally becomes non-linearly related to the input photocurrent. The non-linear relation of the output voltage may make it difficult to utilize the transimpedance amplifier output voltage to linearly track and monitor the input photocurrent and optical input power. In a case where automatic gain control is employed and a nonlinear transimpedance versus input power results, a device for producing a monitor current or voltage which is linearly related to the incident photocurrent is desired. The circuit 100 of FIG. 2b may provide such desired functions when applied to an automatic gain control TIA.

The circuit 100 of FIG. 2b further comprises a circuit 110. The circuit 110 may be implemented as a current monitoring circuit. The circuit 110 generally comprising a transistor (e.g., QMON) and a resistor (e.g., RE•N). The circuit 110 may provide a current mirror transistor (e.g., the transistor QMON) with a gain of 1/N, where N is defined as the ratio of an emitter area of transistor QFB and an emitter area of the transistor QMON. An emitter degeneration resistor (e.g., the resistor RE•N) coupled to the emitter of the transistor QMON may be set at a value which is N times the emitter degeneration resistor RE of the transistor QFB. As the automatic gain control circuit 104 detects a strength of the output signal OUTPUT and induces a collector current through the transistor QFB, which is approximately equal to the induced photocurrent at the input 106 of the TIA 102, the current mirror 110 may provide a scaled current (e.g., Imon). The scaled current Imon may be approximately equal to the induced (received) photocurrent Ipd divided by the current mirror gain, N. The current Imon may be accessed or monitored by connecting an an-meter at a node 112 for measuring the DC current. In this manner, the circuit 100 may allow incident optical power monitoring in the instance where AGC is employed with a TIA. The circuit 100 of FIG. 2b generally provides the end user with a monitoring current Imon that is linearly proportional to the induced photocurrent and received optical input power. Additionally, the monitoring current Imon may be utilized within a control loop.

Figure 3A:
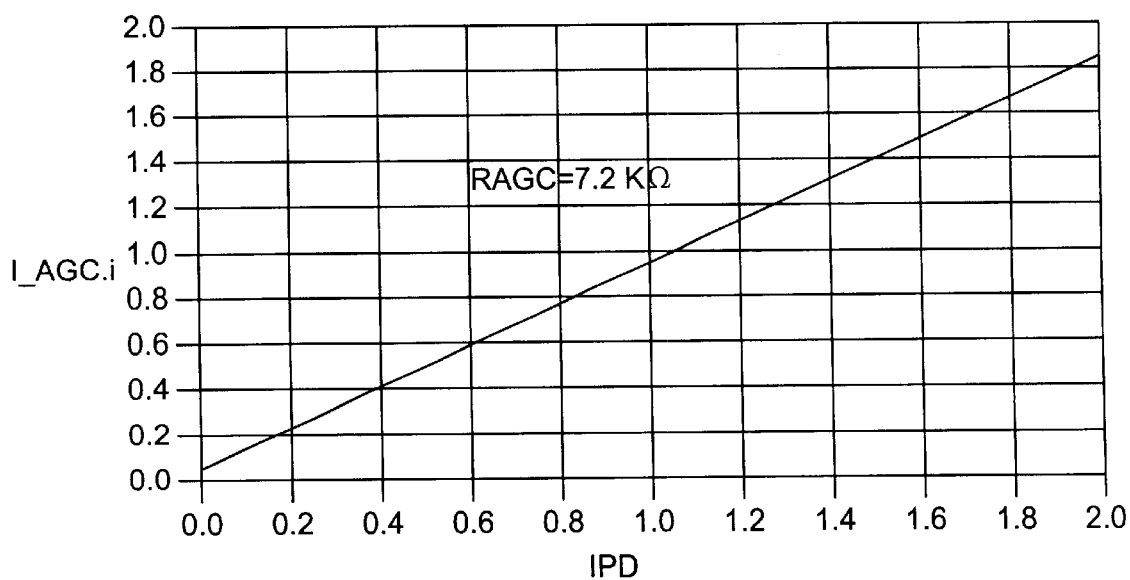
FIGS. 3(a–c) are transfer functions illustrating the automatic gain control operations of the present invention.
Figure 3B:
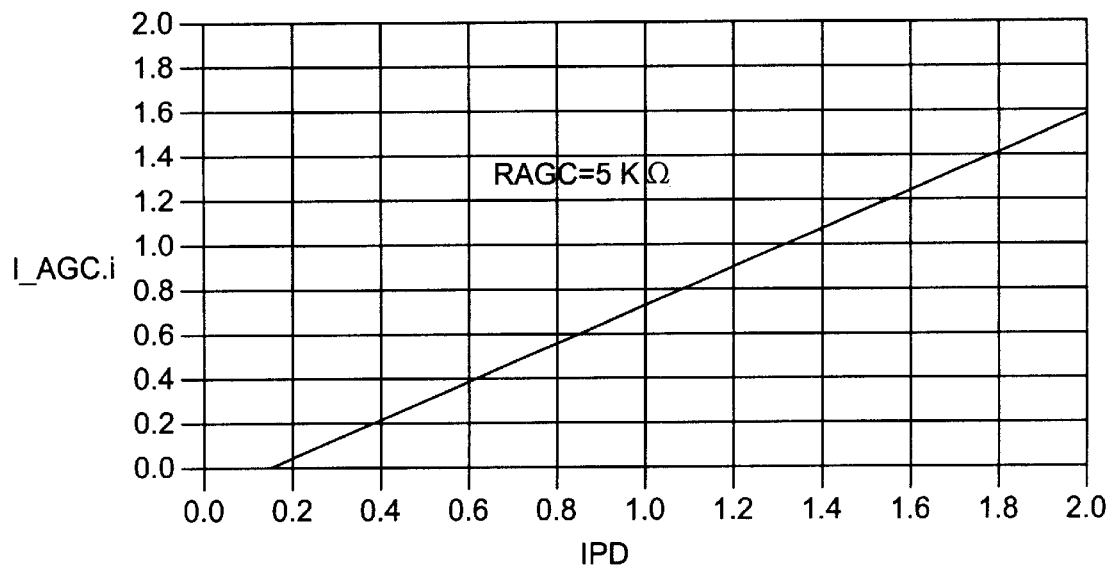
Figure 3C:
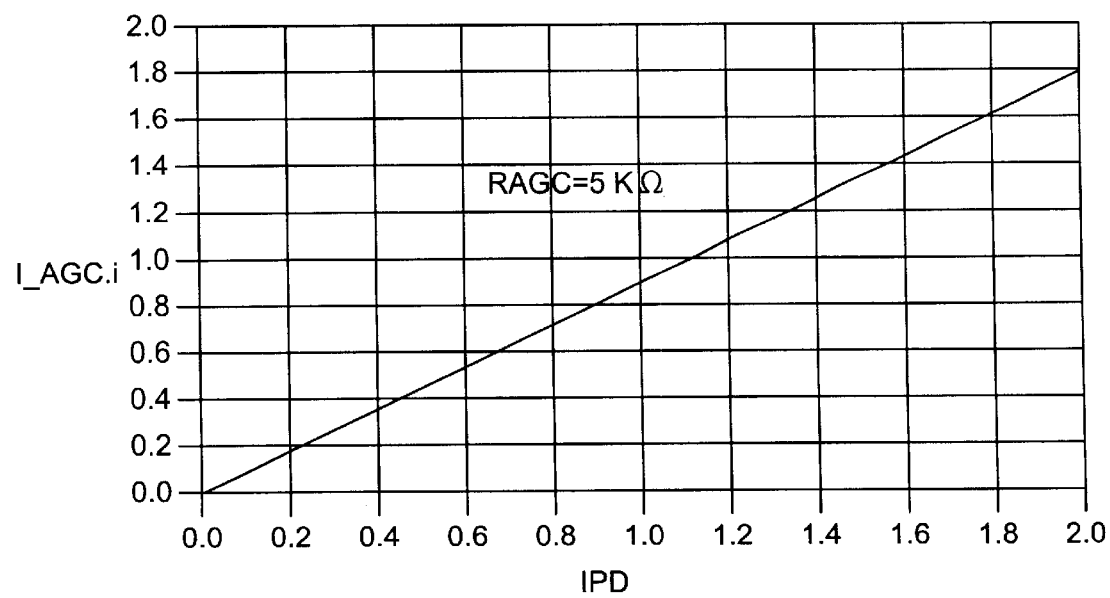

FIGS. 3(a–c) illustrate the AGC current (e.g., I_AGC.i of the current switch transistor QFB) vs. the optically induced input photo-detector current (e.g., Ipd from the diode Pd1) for various values of the resistor R2. For smaller values of the resistor R2, the AGC current I_AGC.i begins to turn on at a higher input photo-diode current Ipd. In this manner, the dynamic range of the circuit 100 may be increased. When the resistor R2 is equal to 7.2 Kohms (FIG. 3a), a higher photo-diode input current can be handled without distortion. However, an additional 0.1 mA of shot noise may be contributed due to the quiescent bias current of the transistor QFB when the current Ipd is zero. When the resistor R2 is equal to 5 Kohms (FIG. 3b), there will be no shot noise contribution due the quiescent bias current of the transistor QFB until the input current Ipd reaches 0.1 mA. However, duty-cycle distortion and ISI may be slightly increased for higher current Ipd where the current I_AGC.i is slightly compromised relative to the case where the resistor R2 is equal to 7.2 Kohms. FIG. 3c illustrates a possible optimum case where both low shot noise contribution at Ipd=0 and low distortion at high input Ipd are achieved.

The circuit 100 provides a conceptual diagram of a high dynamic range photo-receiver which comprises the photo-detector diode Pd1, the transimpedance amplifier 102 and the automatic gain control circuit 104. The automatic gain control (AGC) circuit 104 is applied to a non-inverting amplifier which is represented by the amplifier 102 and the transimpedance feedback resistor RFB. The AGC circuit 102 may be specifically configured to detect the signal strength of the optically induced photodiode Pd1 and the feedback signal FB. The feedback signal may be a DC signal proportional to the bipolar transistor QFB. The transistor QFB may act as a variable current source at the input of the TIA 102 and may shunt the overdrive photo-diode current Ipd to ground instead of into the input of the amplifier 102.

Compared to the approach cited in [1], the circuit 100 reduces the input photo current excitation presented to the input of the amplifier 102 when large optical power is incident on the photo-diode detector Pd1. The circuit 100 may be implemented instead of employing a variable resistor feedback element such as a variable resistor of the FET channel conduction to variably change the feedback gain of the transimpedance amplifier as disclosed in [1]. In this manner, the circuit 100 addresses the root cause of the nonlinearity. In particular, the effect of the excessively high input photo current excitation is reduced at the input of the amplifier 102 before the signal has a chance to become distorted during amplification. Most conventional amplifiers typically attenuate the large incident input signal by variably adjusting the gain of the preamplifier in order to reduce the signal amplitude introduced to subsequent amplifier stages. In contrast, the circuit 100 attenuates the signal PR_INPUT before being presented to the amplifier 102.

Compared to the current switch linearizer cited in [4], the circuit 100 comprises a single ended current switch coupled to the single-ended input of an inherently lower noise common-emitter input stage. In contrast, [4] implements a differential current switch applied to an inherently noisier differential common-base input stage of a transimpedance amplifier. The circuit 100 accomplishes a high dynamic range without compromising input sensitivity by applying the current switch QFB to quieter single-ended common-emitter input stage of the amplifier 106. In addition, the current switch QFB shunts the excessive input excitation current to ground, whereas the differential current switch of [4] shunts the excessive input excitation current to the output.

Figure 4:
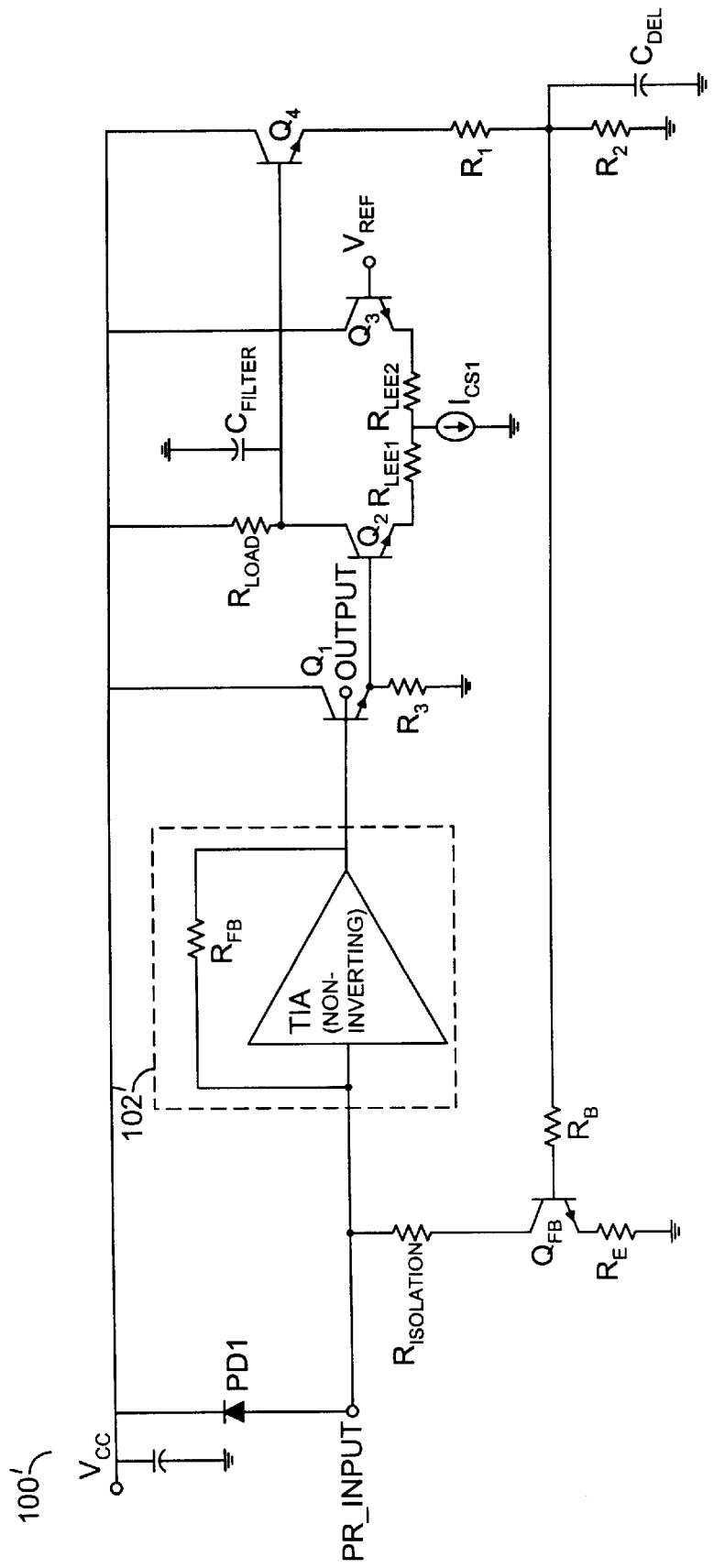
FIG. 4 is a detailed block diagram of an alternate embodiment of the present invention as applied to an inverting transimpedance amplifier.

Referring to FIG. 4, an example of a circuit 100' is shown implementing an inverting transimpedance amplifier. The circuit 100' may be similar to the circuit 100. The circuit 100' illustrates an amplifier 102' implemented as an inverting amplifier where the voltage swing of the signal OUTPUT is out of phase with the voltage swing of the signal INPUT. The primary difference between the circuit 100' (FIG. 4) and the circuit 100 (FIG. 2a) is that the load resistor Rload is attached to the collector of the transistor Q2. Additionally, the filter capacitor Cfilter is also applied to the collector of the transistor Q2. The operation of each of the other elements is generally similar to the operation described in connection with the circuit 100 of FIGS. 2(a–b).

Figure 5:
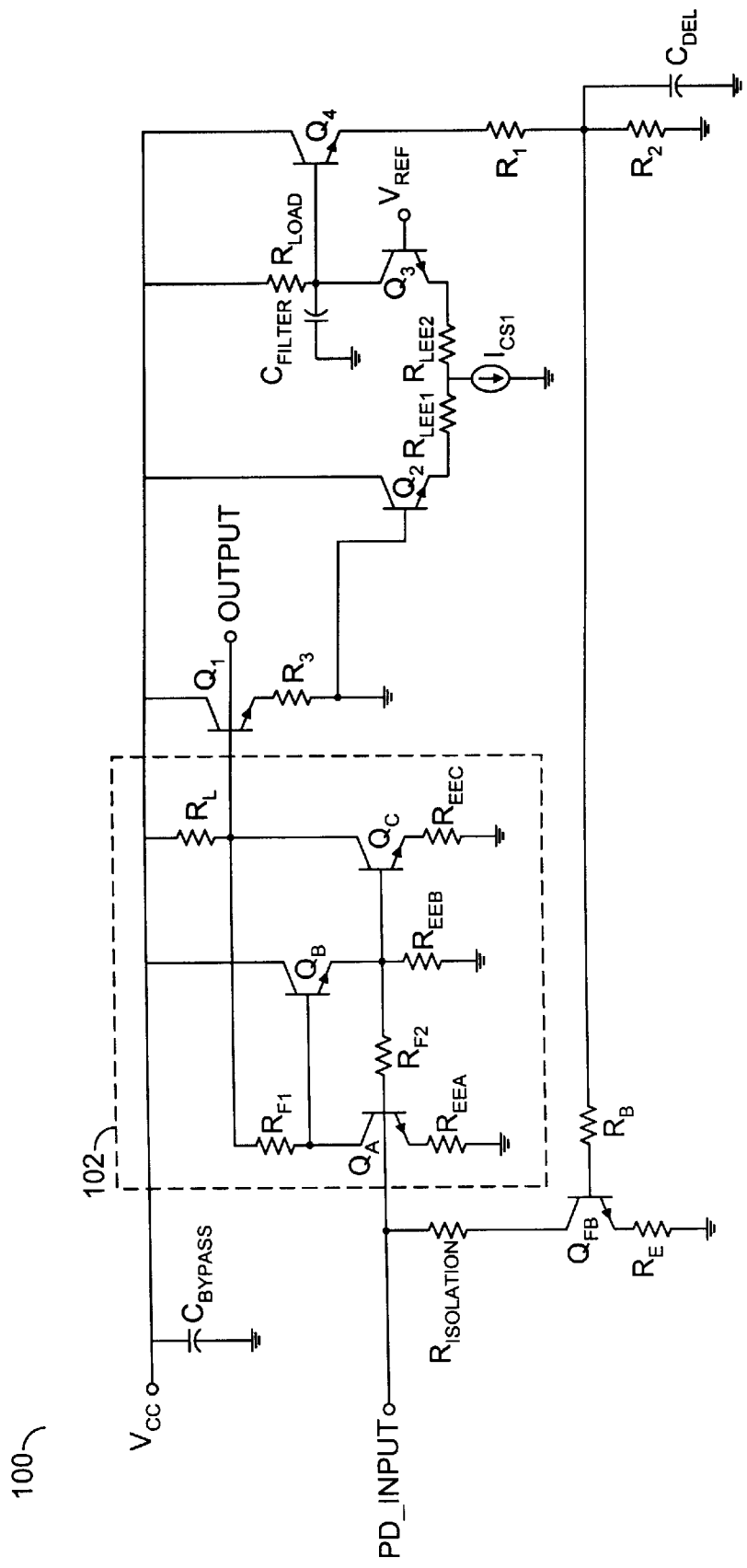
FIG. 5 is a more detailed diagram of the present invention.
Figure 6A:
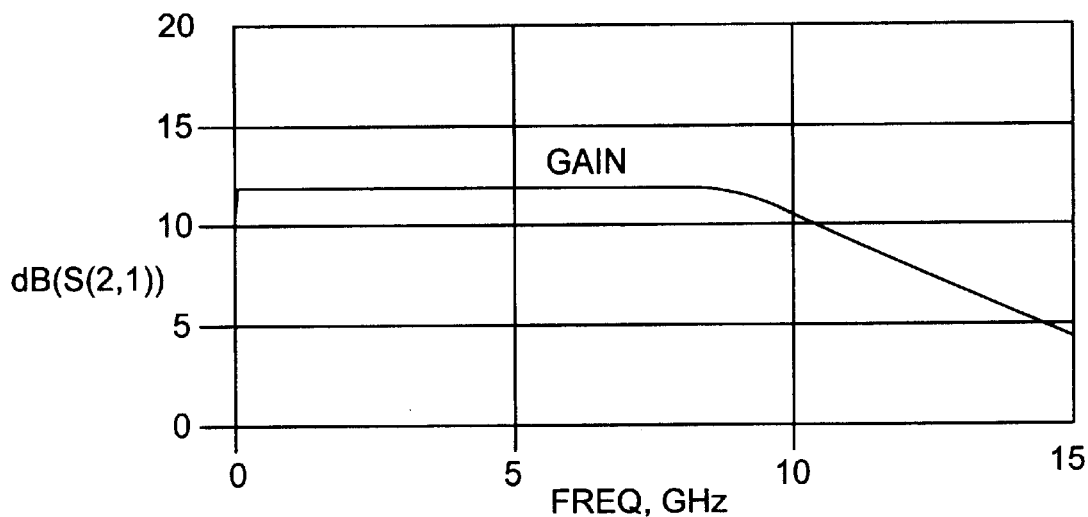
FIGS. 6(a–b) are transfer curves illustrating the linear wideband gain operations of the present invention for various average detected input current (Ipd=0–2 mA)
Figure 6B:
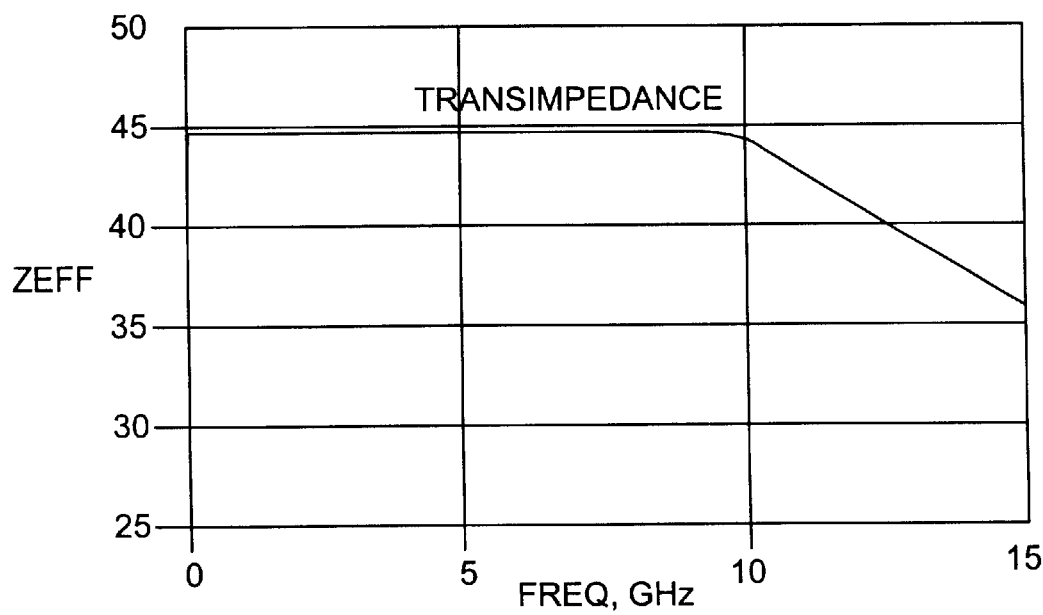

Referring to FIG. 5, a detailed diagram of the circuit 100 is shown illustrating a detailed topology of a non-inverting TIA implementation. The amplifier 102 generally comprises a transistor QA, a transistor QB, a transistor QC, a resistor REEA, a resistor REEB, a resistor REEC, a resistor RF1, a resistor RF2 and a resistor RL. The resistors REEA, REEB, REEC may be emitter degeneration resistors for adjusting gain and bandwidth. The resistors RF1 and RF2 may be parallel feedback resistors also used for adjusting gain and bandwidth. The resistor RL may be a load resistor. While a specific implementation of the amplifier 102 is shown, variations may be made to meet the design criteria of a particular implementation. All other components are generally similar in function to those described in FIGS. 2(a–b).

Referring to FIGS. 6–11, various performance plots of the circuit 100 are shown. FIGS. 6a and 6b illustrate a 50 ohm gain db(S(2,1)) and effective transimpedance amplification of the circuit 100 over an average input photo-detector current Ipd ranging from 0 to 2 mA. In one example, the circuit 100 may be implemented in a heterojunction bipolar transistor (HBT) device technology which has a typical frequency of 35 GHz and a maximum frequency of 50 GHz. The effective transimpedance gain incorporates the model of a typical photo diode (Cpd=0.3 pF and Rcontact=15 ohms). However, other process technologies and/or parameters may be used to meet the design criteria of a particular implementation. FIG. 6a illustrates a gain (12 dB) and a bandwidth (11 GHz) response of the amplifier 102 that is insensitive or unaffected by changes in average current Ipd up to 2 mA. FIG. 6b illustrates a transimpedance gain (45 dB-ohm) and a bandwidth (12.5 GHz) that is also generally impervious to average current Ipd up to 2 mA. The immunity to current variations is due to the employment of the control circuit 104.

Figure 7A:
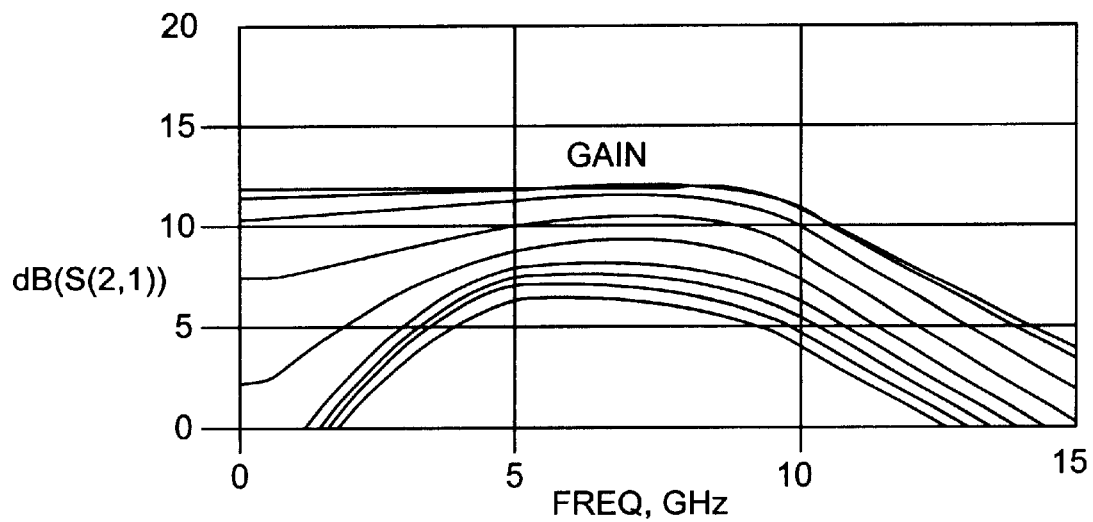
FIGS. 7(a–b) are transfer curves illustrating the non-linear wideband operations of conventional amplifiers for various average detected input current (Ipd=0–2 mA)
Figure 7B:
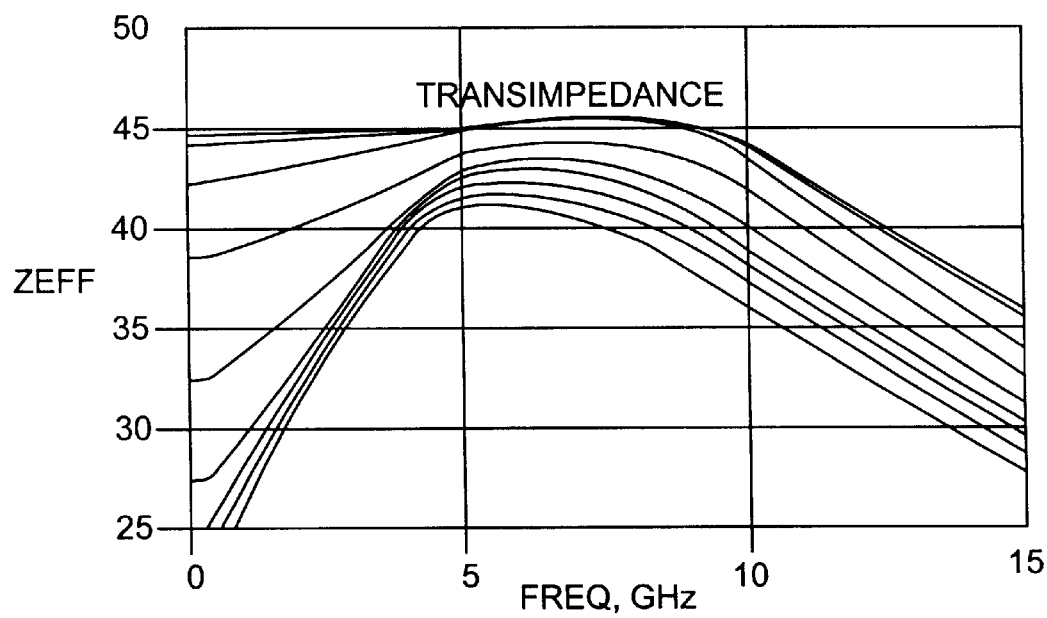

FIGS. 7a and 7b illustrate the effect of high incident photo-current Ipd on the non-inverting amplifier 102 without the employment of the control circuit 104. The various traces represent different current values. As illustrated, the gain and transimpedance of the TIA 102 becomes very sensitive to photo diode input excitation with gross distortion in gain and bandwidth. Consequently, the TIA 102 alone would be inadequate for most fiberoptic applications. While some conventional approaches offer bipolar topology solutions to such gross distortions (such as the common-base [2], complementary common-base [3], and differential common-base [4] topology approaches), such conventional approaches all suffer from high input referred noise due to the high input shot noise generated by emitter current Ie (In=2q*Ie). Thus, the circuit 100 may also preserve the low noise performance of a low noise TIA topology while extending an upper dynamic range.

Figure 8:
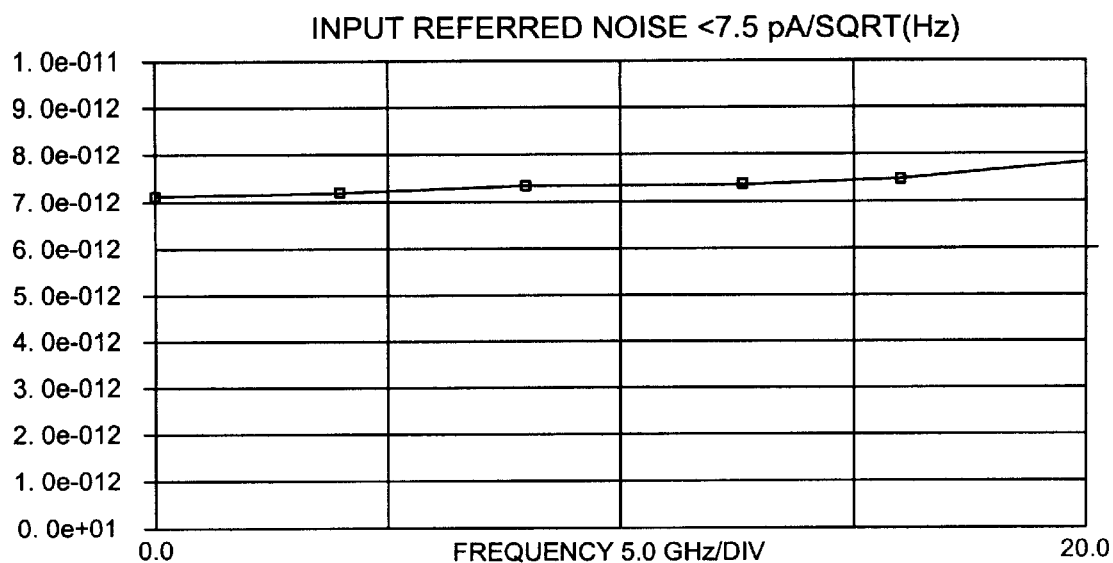
FIG. 8 is a transfer curve illustrating the preserved low input referred noise performance of the present invention.
Figure 9:
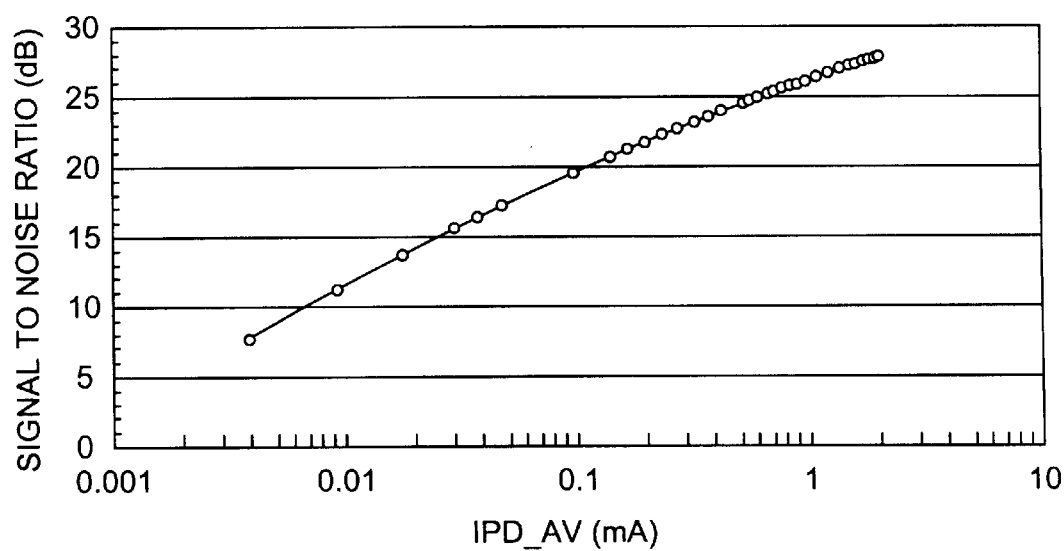
FIG. 9 is a transfer curve illustrating the wide dynamic range operation of the present invention.

FIG. 8 illustrates the broadband input referred noise performance of the circuit 100 which obtains <7.5 pA/sqrt (Hz) noise performance up to 10 GHz. The performance of the circuit 100 is typically a factor of 2 better than the common-base approach cited in [2] and [3]. The corresponding dynamic range of the circuit 100 is shown in FIG. 9. Signal to noise ratios in excess of 10 dB can be obtained with as little as 10 uAs of average input photo-detector current.

Figure 10:
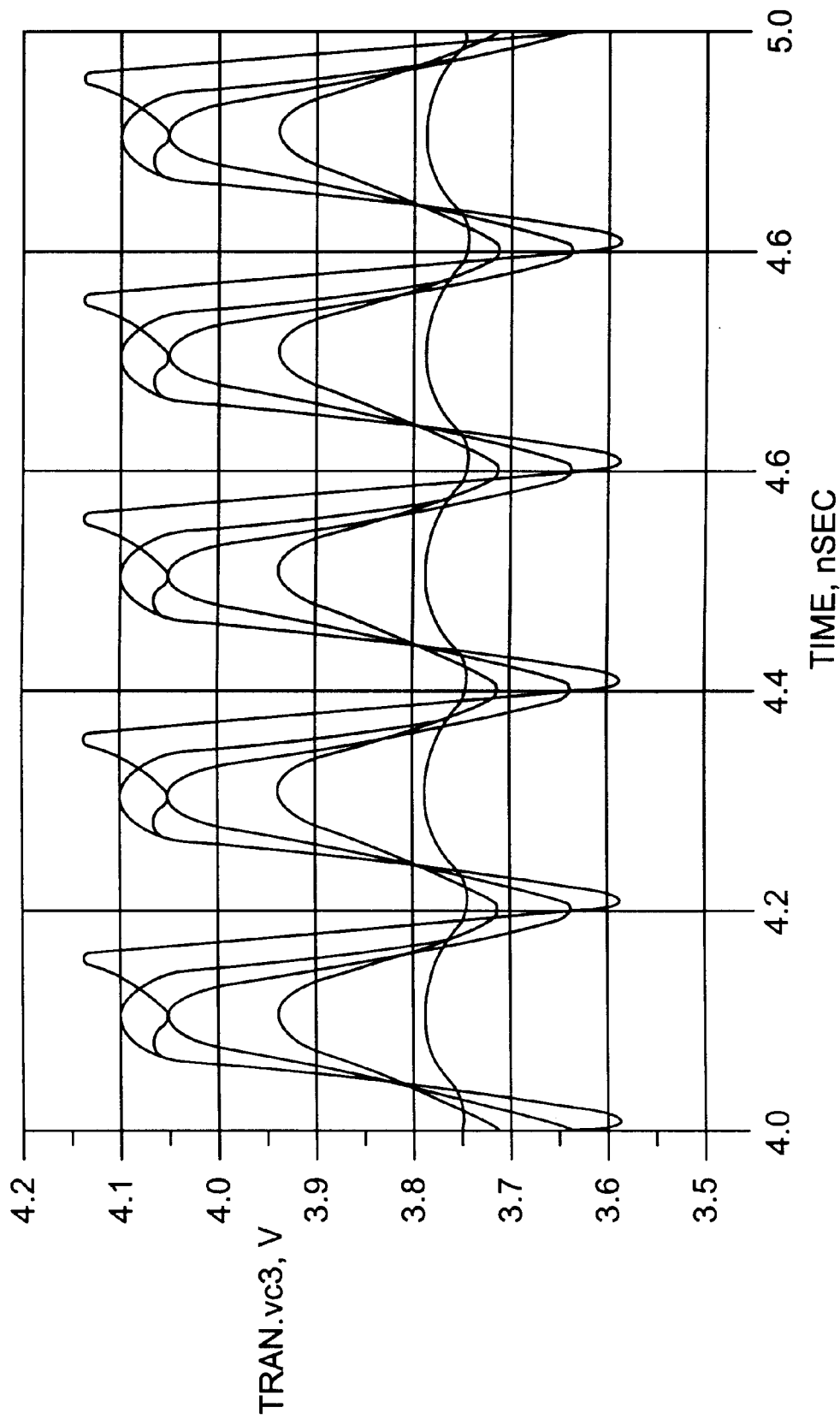
FIG. 10 is a transfer curve illustrating the non-linear large signal operation of a conventional amplifier for various average detected input current (Ipd=0–2 mA)
Figure 11:
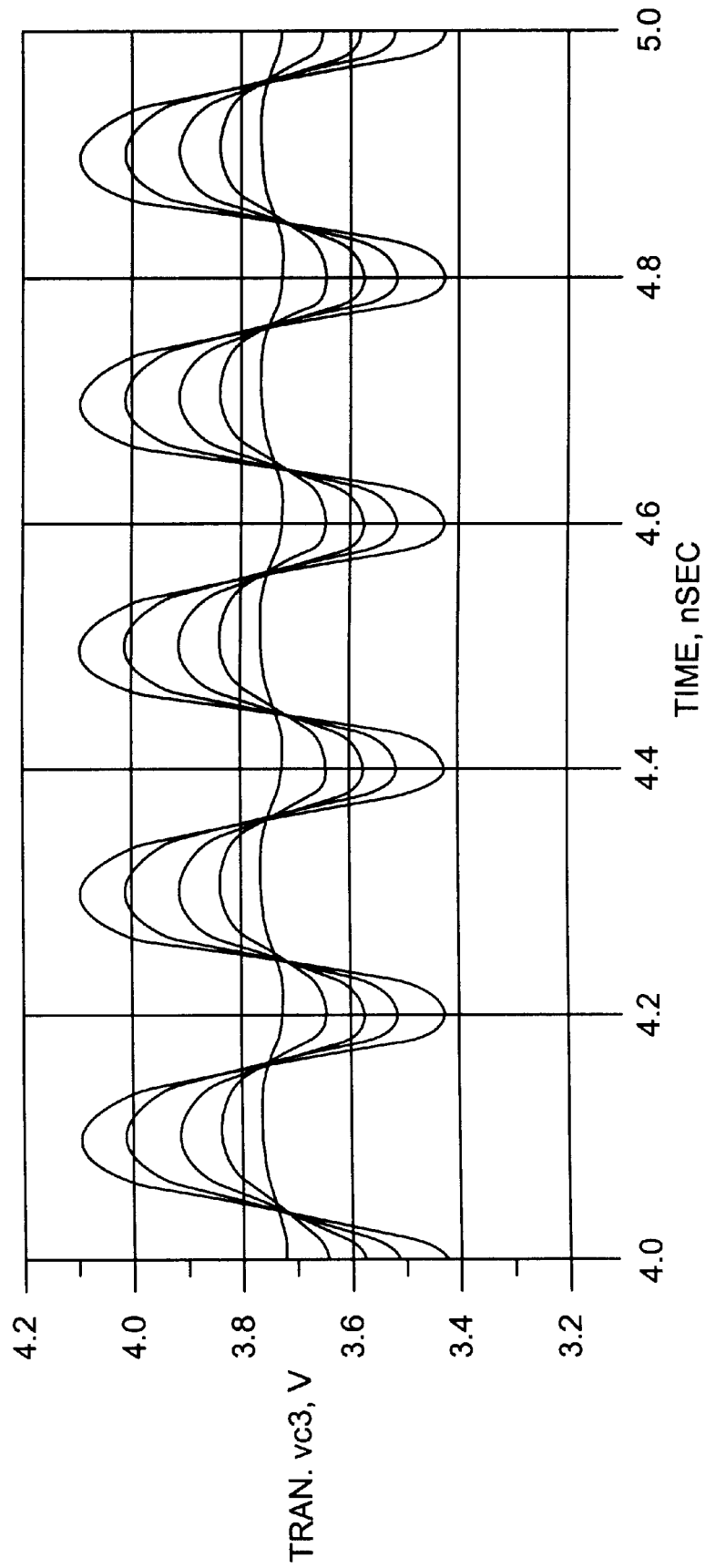
FIG. 11 is a transfer curve illustrating the linear large signal operation of the present invention for various average detected input current (Ipd=0–2 mA)

At higher currents Ipd, the dynamic range limitation is waveform distortion measured in duty-cycle distortion (e.g., measured in percent of absolute time or percentage of total bit period compared to a 50% duty cycle ideal waveform) or BER (e.g., bit error rate, measured in bit errors per second). The general waveform distortion is illustrated in FIGS. 10 and 11 which illustrate the output waveform qualitative distortion characteristics for various Ipd inputs at a maximum data rate of 10 Gb/s. In particular, FIG. 10 shows that duty-cycle and waveform distortion is apparent when input photo-detector current is increased for the TIA without the AGC employed. As the current Ipd increases beyond 0.6 mA, the waveform starts to look asymmetrical with very poor duty cycle distortion (compared to the ideal 50% duty cycle sine wave). FIG. 11 illustrates the preservation of the signal linearity when the control circuit 104 is employed. A symmetrical sinusoidal waveform is preserved over a current Ipd range from 0.1 to 2 mA. Quantitatively, the duty cycle distortion improves from 36 pS (18%) for the case without the circuit 104 to less than 2 pS (1%) when implementing the control circuit 104.

Figure 12:
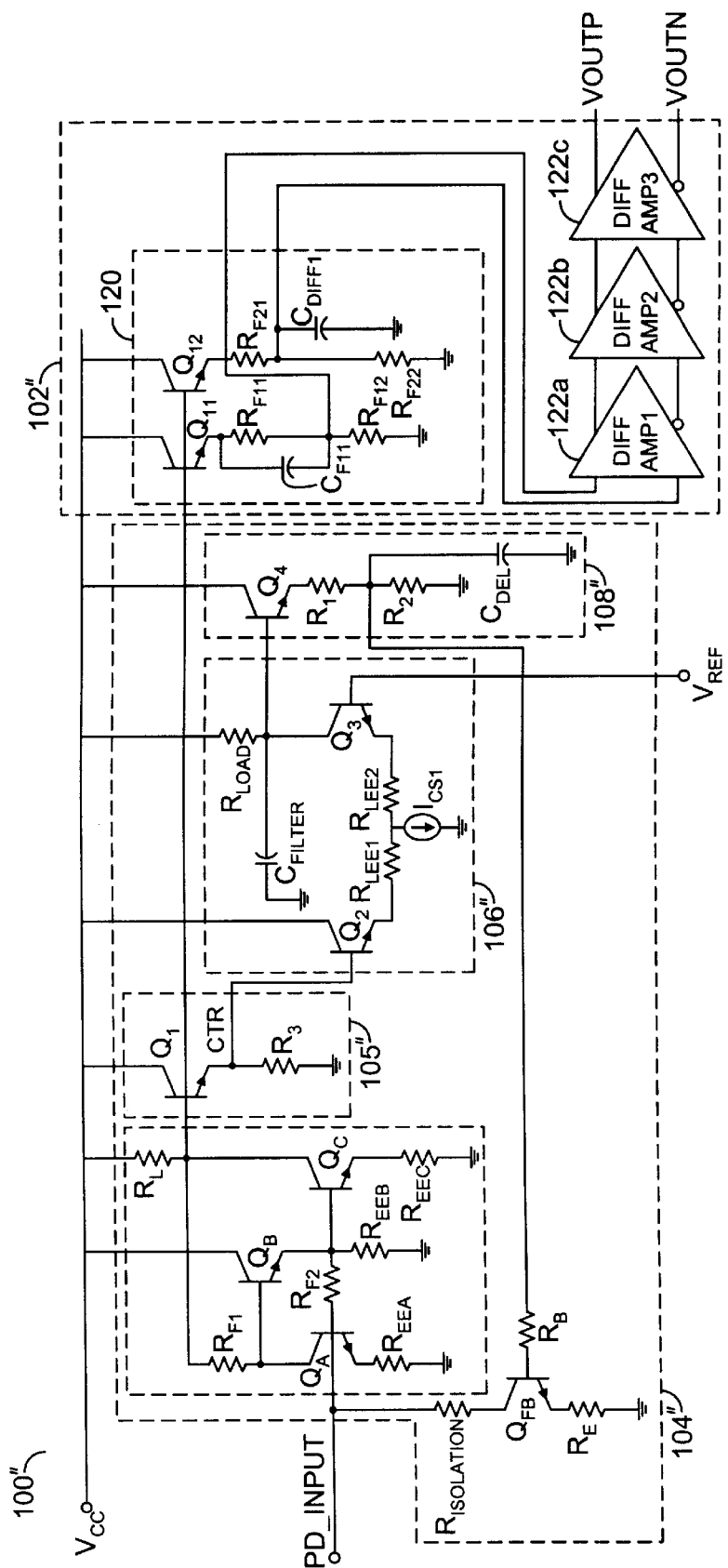
FIG. 12 is a diagram of another alternate embodiment of the present invention which includes single-ended to differential conversion.

Referring to FIG. 12, a circuit 100" is shown illustrating an alternate embodiment that can be extended to another application where two differential outputs are needed. The circuit 100" may be similar to the circuit 100. The circuit 100" provides singled-ended to differential conversion in order to obtain a differential output. The circuit 100" may additionally implement a single-ended to differential conversion circuit 120 and a number of cascaded output differential amplifiers 122a–122n (e.g., DIFFAMP1-DIFFAMP3).

The circuit 120 generally converts a single ended signal (e.g., PD_INPUT) to a differential signal presented to the amplifiers 122a–122n. The separate transistors Q11 and Q12 drive separate inputs to the differential amplifiers 122a–122n. The transistor Q11 and the transistor Q12 are generally configured as emitter followers. The transistor Q11, the resistor Rf11 and the resistor Rf12 generate a first portion of the differential signal. The transistor Q12, the resistor Rf21 and the resistor Rf22 generate a second portion of the differential signal. The capacitor Cdiff1 generally provides filtering. Therefore, the converter circuit 120 generally provides a balanced differential signal.

The single-ended to differential conversion circuit 120 is basically a differential amplifier which is driven single-endedly at a first input with a second input bypassed to ground. The circuit 120 may allow the DC bias voltage of the bypassed input to track the DC average voltage of the single-ended driven input in order to minimize DC voltage offset and associated duty-cycle distortion at the differential outputs. Outputs of the voltage divider resistors Rf11, Rf12, Rf21 and Rf22 are fed directly to the complementary inputs of the succeeding differential amplifier 122a (DIFFAMP1). The first input of the differential amplifier 122a may be bypassed to ground with a bypass capacitor (e.g., Cdiff1). The second input of the differential amplifier 122a is driven by the signal directly without a bypass capacitor.

The differential amplifier 122a may be essentially driven single-endedly. The capacitance value of bypass capacitor Cdiff1 may be chosen in order to produce a DC voltage bias which is roughly proportional to the DC average voltage of the incoming data signal at the other input of the differential amplifier 122a. The bypass capacitor Cdiff1 is generally connected to voltage divider comprised of resistors Rf21 and Rf22, the value of which sets the integration time constant of the "RSS" detection leg. Resistor Rf21 is generally required to ensure that the single-ended input to the amplifier 122a is delivered a DC average voltage and not a DC peak voltage. The DC voltage produced at the input of differential amplifier 122a is essentially equal to the DC average voltage of the other input which varies with varying signal strength. Thus, the circuit 100" minimizes the DC offset at the input of the differential amplifier 122a and inhibits the propagation of duty-cycle distortion and ISI through subsequent differential amplifier stages (e.g., the differential amplifiers 122b and 122n). An optional AC coupling capacitor (e.g., Cf11) can be implemented to bypass the resistor Rf11 in order to recover the gain lost by the voltage division produced by the resistors Rf11 and Rf22 on the direct signal path.

Figure 13A:
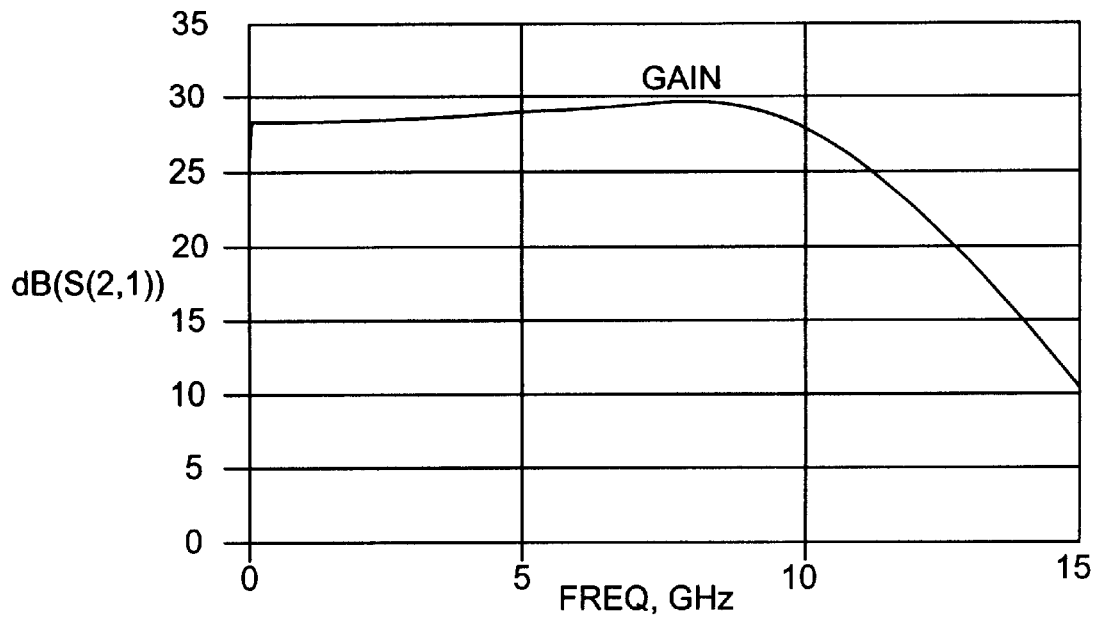
FIGS. 13(a–b) are transfer curves illustrating the linear wideband gain operations of the present invention for various input current (Ipd=0–2 mA)
Figure 13B:
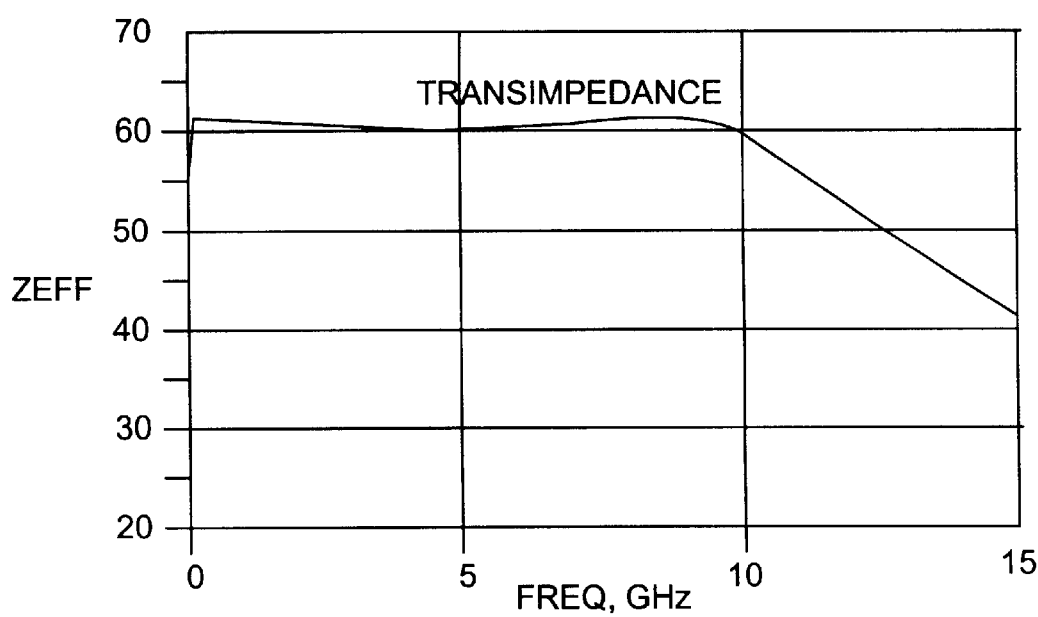

FIGS. 13a and 13b illustrate the gain and transimpedance performance of the circuit 100" for average input photo-detector currents ranging from 0 to 2 mA. FIGS. 13a and 13b illustrates that both the gain and transimpedance are generally impervious to input photo-detector currents up to 2 mA. FIG. 13a illustrates that the 50 ohm gain db(S(2,1)) is nominally 27.5 dB with a bandwidth >12 GHZ. FIG. 13b illustrates that the transimpedance is 60 (dB-ohm) single-ended and (66 dB-ohm) differential with a bandwidth of >10 GHz.

Figure 14A:
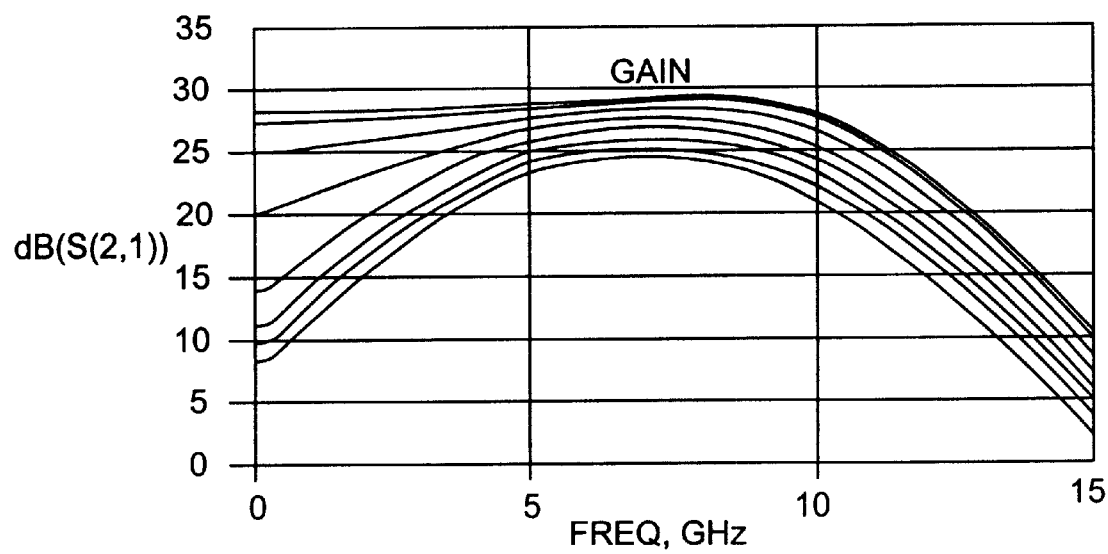
FIGS. 14(a–b) are transfer curves illustrating the nonlinear wideband gain operations of conventional amplifiers for various input currents (Ipd=0–2 mA)
Figure 14B:
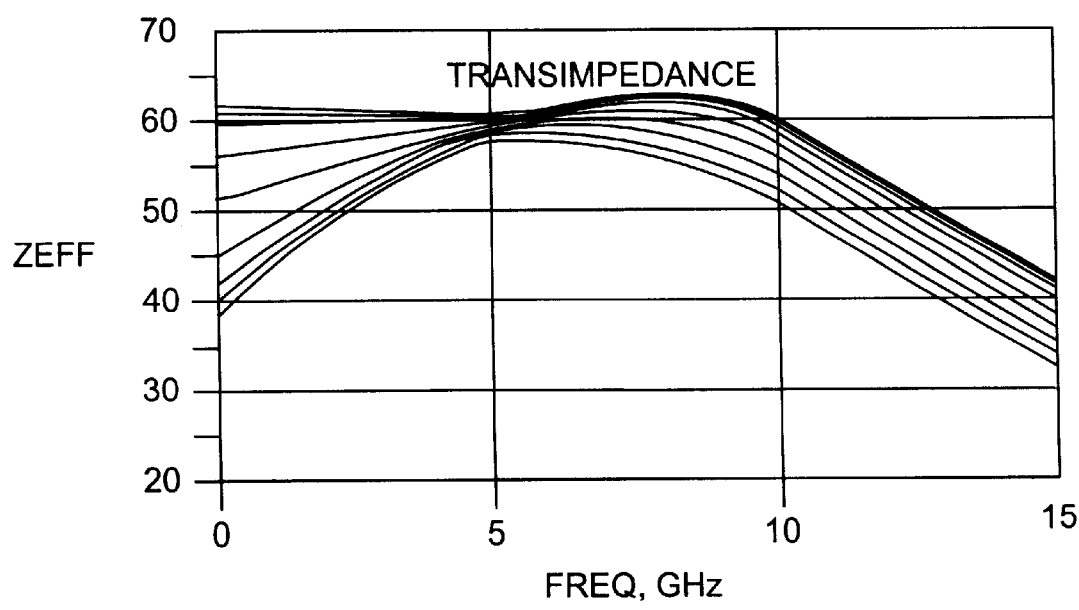

FIGS. 14a and 14b illustrates the multistage circuit 100" circuit without the employment of the AGC circuit 104". FIGS. 14a and 14b illustrate the dramatic distortion in gain and transimpedance with increasing input signal strength which is inadequate for most practical fiber optic applications.

Figure 15A:
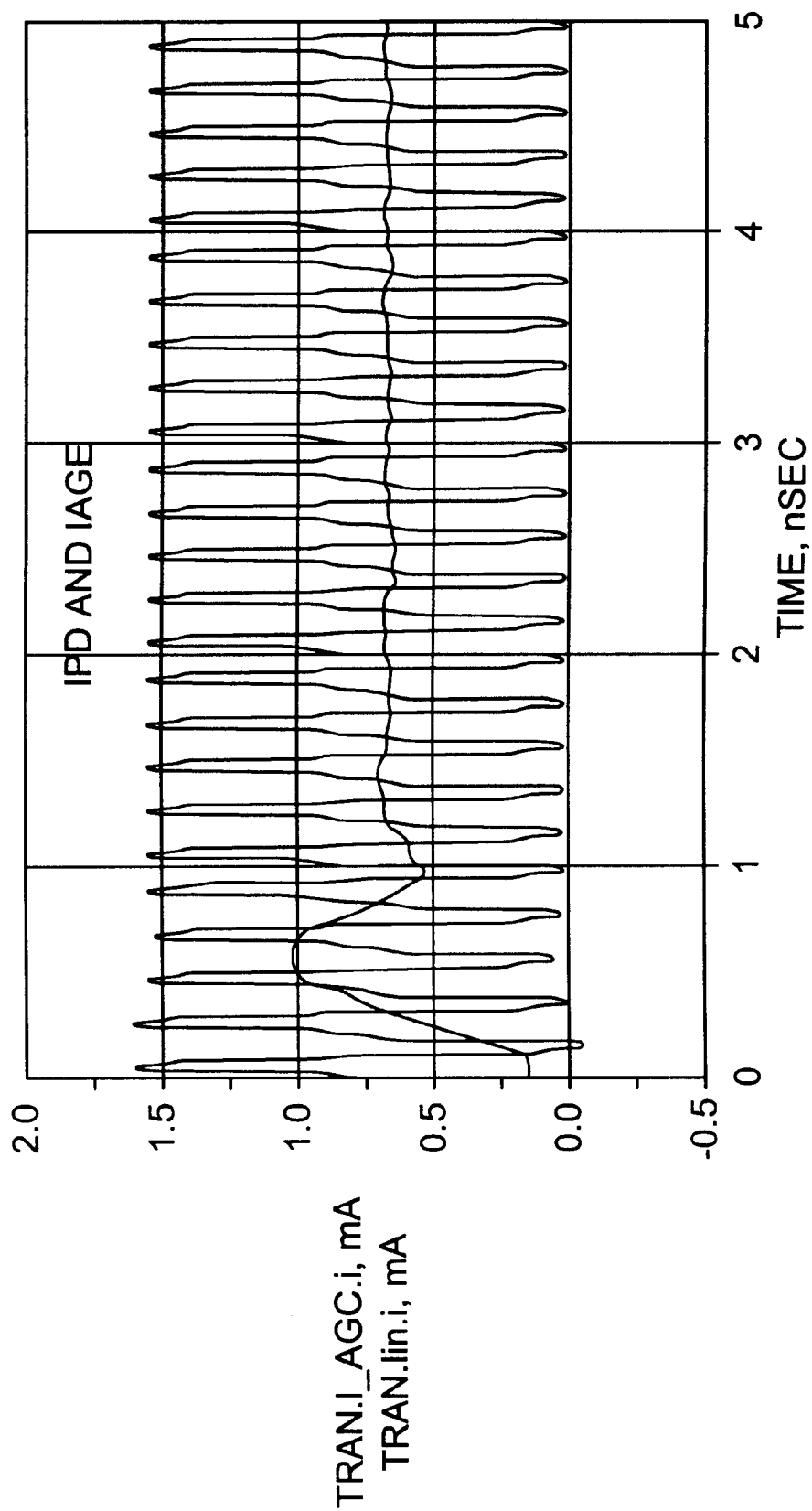
FIGS. 15(a–c) are transfer curves illustrating operations of the present invention a) Ipd and Iage versus time, b) voltage at inputs of a first stage of a differential amplifier, c) a differential output voltage.
Figure 15B:
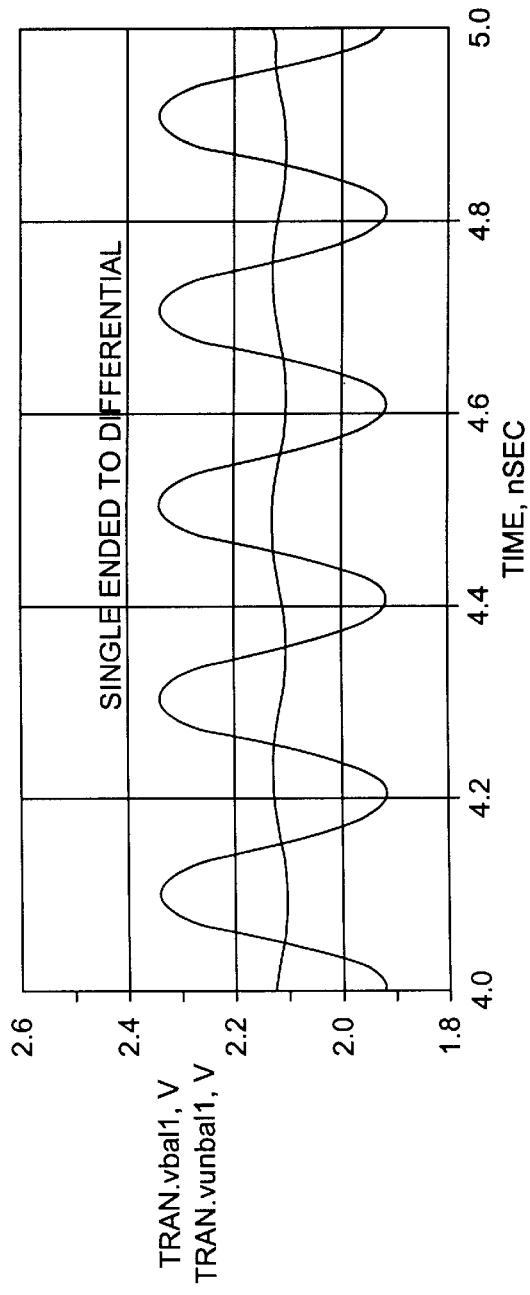
Figure 15C:
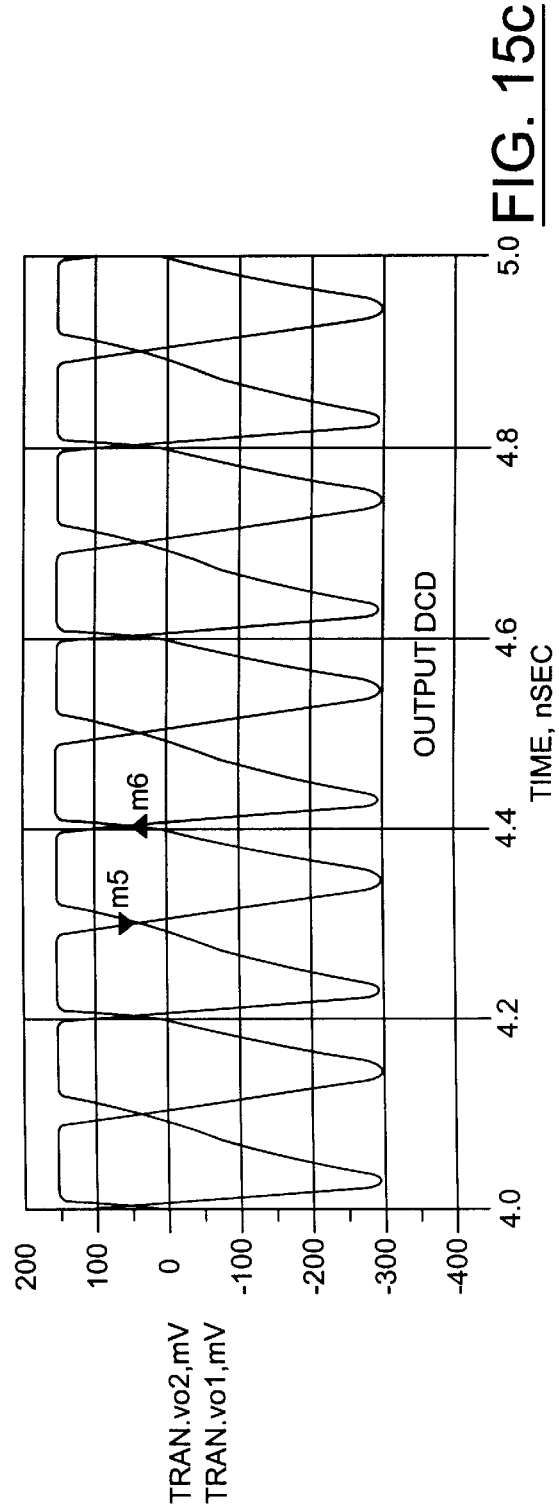

FIGS. 15a, 15b and 15c illustrate the operation of the circuit 100" under an average input photo-detector current of 0.8 mA at 10.7 Gb/s. FIG. 15a illustrates the AGC.i current switch (QFB) current which rises to the average photo-diode input current in order to linearize the TIA stage. FIG. 15b illustrates the input signals to the differential amplifier 122a (DIFF AMP1) where one input receives the signal and the other input obtains the DC average of the signal in order to minimize output DC offset voltage which can produce undesirable output waveform distortion. FIG. 15c is the associated output waveform and illustrates a duty-cycle distortion (DCD) of 4 pS peak-to-peak. A typical DCD of >8 pS is predicted for the case without the employment of the AGC circuit 104.

Figure 16:
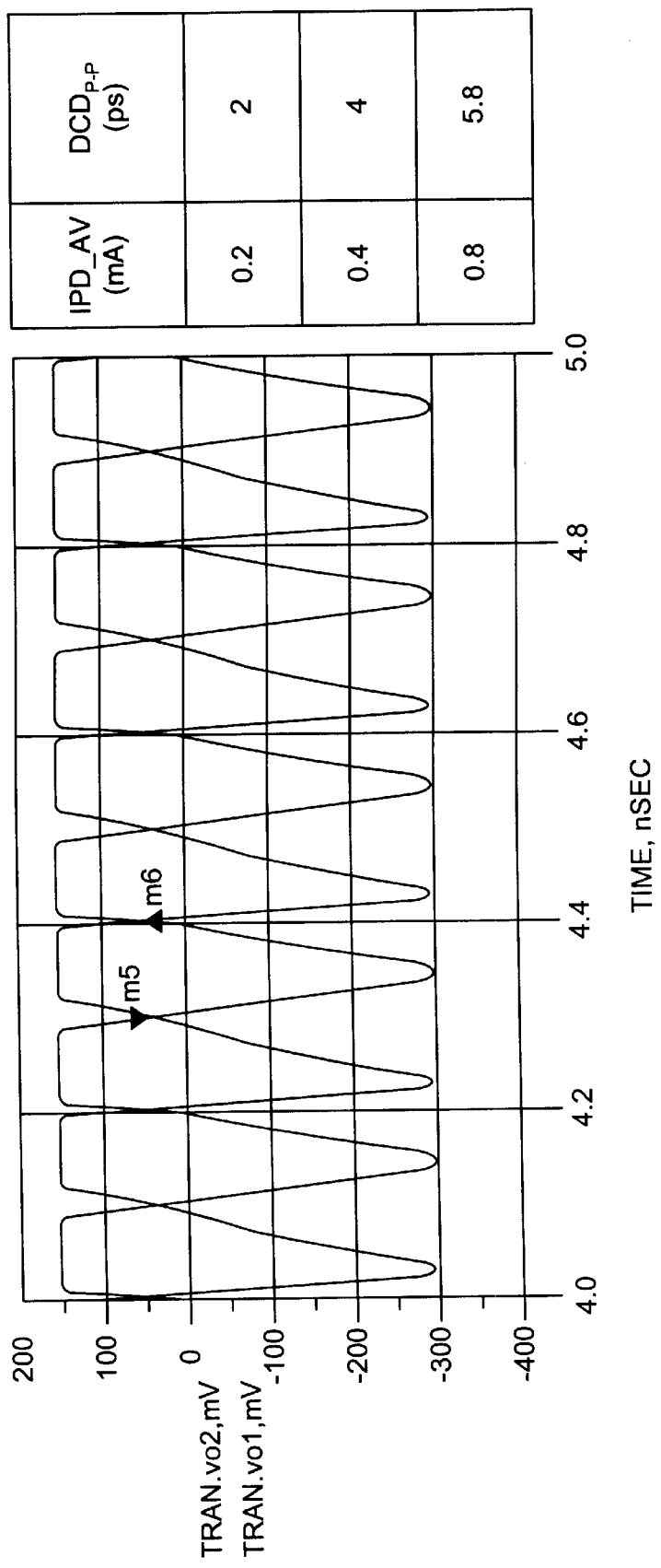
FIG. 16 is a transfer curve illustrating an operation of the present invention (differential output voltage and duty cycle distortion (DCD) versus input detector current).

FIG. 16 illustrates the duty-cycle distortion versus average input current Ipd. For average input currents of 0.8 mA or 1.6 mA peak-to-peak, a DCD of <6 pS is obtained. The associated waveform measurement is given as an example.

The present invention describes a circuit and/or method for achieving wide dynamic range of a low noise amplifier for wireless RF applications or a transimpedance amplifier for fiber-optic applications, without sacrificing the low noise input sensitivity of the amplifiers. More specifically, the present invention describes a unique automatic gain control which improves the linearity and reduces the distortion of a received amplified signal. The need for improved linearity and reduced distortion stems from the varying incident signal power strengths that a low noise amplifier (LNA) must encounter due to varying distances and attenuations between the transmitter and receiver.

In particular, the present invention describes an automatic gain control that may be used with a broadband transimpedance amplifier intended for use in fiber-optic receiver applications, and more specifically a bipolar amplifier implementation using heterojunction bipolar transistor technology.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
   an amplifier circuit configured to generate an amplified signal in response to an input signal; and
   a control circuit comprising a differential amplifier having (i) a first input coupled to said amplified signal and (ii) a second input coupled to a reference voltage, wherein said control circuit is configured to (a) control a gain of said amplifier circuit by adjusting said input signal based on (i) a magnitude of said amplified signal and (ii) said reference voltage and (b) improve linearity of said amplified signal.

2. An apparatus comprising:
   an amplifier circuit configured to generate an amplified signal in response to an input signal;
   a control circuit comprising (a) a differential amplifier having (i) a first input coupled to said amplified signal and (ii) a second input coupled to a reference voltage and (b) an output circuit configured to contribute to controlling said amplifier by averaging an output of said differential amplifier, wherein said control circuit is configured to control a gain of said amplifier circuit by adjusting said input signal based on (i) a magnitude of said amplified signal and (ii) said reference voltage.

3. The apparatus according to claim 2, wherein said control circuit is configured to improve linearity of said amplified signal.

4. The apparatus according to claim 1, wherein said reference voltage is adjustable after fabrication of said apparatus.

5. The apparatus according to claim 1, wherein said amplifier circuit comprises a transimpedance amplifier.

6. The apparatus according to claim 5, wherein said differential amplifier is implemented using heterojunction hipolar transistors.

7. The apparatus according to claim 1, wherein said control circuit further comprises:
   an output circuit configured to contribute to controlling said amplifier by averaging an output of said differential amplifier.

8. The apparatus according to claim 1, wherein said control circuit further comprises:
   a coupling circuit configured between said amplifier and said differential amplifier, said coupling circuit configured to sample said amplified signal.

9. The apparatus according to claim 1, wherein said control circuit further comprises:
   a feedback device configured between said input signal and ground, wherein said feedback circuit is configured to limit the input signal by shunting a portion of said input signal to ground.

10. The apparatus according to claim 9, wherein said feedback device comprises a single-ended current switch.

11. The apparatus according to claim 1, wherein said apparatus is configured to provide low noise input sensitivity.

12. The apparatus according to claim 1, wherein said control circuit is configured to reduce distortion of said amplified signal.

13. The apparatus according to claim 1, wherein said control circuit is configured to minimize a DC offset of said input signal and inhibit propagation of duty-cyclo distortion and intersymbol interference (ISI).

14. The apparatus according to claim 1, further comprising:
    a single ended to differential ended conversion circuit configured to generate a differential signal in response to said amplified signal.

15. The apparatus according to claim 14, wherein said single ended to differential ended conversion circuit comprises a first and second transistor, each configured as emitter followers.

16. The apparatus according to claim 1, wherein said control circuit is further configured to monitor optical power through a monitoring current.

17. The apparatus according to claim 1, wherein said control circuit further comprises a feedback transistor configured to operate as a controlled current switch, sourcing current proportional to a detected current when a threshold current is exceeded.

18. The apparatus according to claim 1, wherein:
    said amplifier circuit comprises a transimpedance amplifier and a feedback resistor coupled to an input and an output of said transimpedance amplifier; and
    said control circuit comprises a plurality of transistors, wherein a first at least one of said plurality of transistors is coupled to said input of said transimpedance amplifier and a second at least one of said plurality of transistors is coupled to said output of said transimpedance amplifier, each of said plurality of transistors having one or more resistors coupled to at least a collector or an emitter.

19. The apparatus according to claim 1, wherein said control circuit comprises:
    a feedback transistor having a collector coupled to a first side of an isolation resistor, an emitter coupled to a first side of an emitter resistor and a base coupled to a first side of a base resistor, a second side of the isolation resistor coupled to said input, a second side of the emitter resistor coupled to ground and a second side of the base resistor coupled to a feedback signal;
    a coupling circuit comprising a first transistor having a collector coupled to a power supply, an emitter coupled to a first side of a first resistor and a base coupled to said amplified signal, wherein a second side of the first resistor is coupled to ground;
    a differential amplifier circuit comprising (i) a first capacitor (ii) a second transistor having a collector coupled to said power supply, an emitter coupled to a first side of a first emitter degeneration resistor and a base coupled to said emitter of said first transistor and (iii) a third capacitor having a collector coupled to said first capacitor and a load resistor, an emitter coupled to a first side of a second emitter degeneration resistor and a base coupled to said emitter of said reference voltage, wherein a second side of said first and second emitter degeneration resistors are coupled to ground; and an output circuit comprising a second capacitor and a fourth transistor having a collector coupled to said power supply, an emitter coupled to one or more third resistors and said second capacitor and a base coupled to said collector of said third transistor, wherein said emitter of said fourth transistor is configured to generate said feedback signal.

20. A method for implementing an amplifier with wide dynamic range comprising the steps of:

(A) generating an amplified signal in response to an input signal; and (B) controlling a gain of said amplifier and improving linearity of said amplified signal by adjusting said input signal based on a magnitude of said amplified signal with a differential amplifier having a control circuit comprising a differential amplifier having (i) a first input coupled to said amplified signal and (ii) a second input coupled to a reference voltage.

21. An apparatus comprising:

an amplifier circuit configured to generate an amplified signal in response to an input signal; and a control circuit comprising a differential amplifier having (i) a first input coupled to said amplified signal and (ii) a second input coupled to a reference voltage, wherein said control circuit is configured to (a) control a gain of said amplifier circuit by adjusting said input signal based on (i) a magnitude of said amplified signal and (ii) said reference voltage and (b) reduce distortion of said amplified signal.

22. The apparatus according to claim 21, further comprising:

a single ended to differential ended conversion circuit configured to generate a differential signal in response to said amplified signal.

23. The apparatus according to claim 21, wherein said single ended to differential ended conversion circuit comprises a first and second transistor, each configured as emitter followers.

24. The apparatus according to claim 21, wherein said control circuit is further configured to monitor optical power through a monitoring current.

25. The apparatus according to claim 21, wherein said control circuit further comprises a feedback transistor configured to operate as a controlled current switch, sourcing current proportional to a detected current when a threshold current is exceeded.

26. An apparatus comprising:

an amplifier circuit configured to generate an amplified signal in response to an input signal; and a control circuit comprising (a) a differential amplifier having (i) a first input coupled to said amplified signal and (ii) a second input coupled to a reference voltage and (b) a feedback device configured between said input signal and ground, wherein (i) said feedback circuit is configured to limit the input signal by shunting a portion of said input signal to ground and (ii) said control circuit is configured to control a gain of said amplifier circuit by adjusting said input signal based on (i) a magnitude of said amplified signal and (ii) said reference voltage.

27. An apparatus comprising:

an amplifier circuit configured to generate an amplified signal in response to an input signal; and a control circuit comprising a differential amplifier having (i) a first input coupled to said amplified signal and (ii) a second input coupled to a reference voltage, wherein said control circuit is configured to (a) control a gain of said amplifier circuit by adjusting said input signal based on (i) a magnitude of said amplified signal and (ii) said reference voltage and (b) minimize a DC offset of said input signal and inhibit propagation of duty-cycle distortion and intersymbol interference (ISI).

* * * * *